United States Patent [19]

Rutledge

[11] 3,747,200

[45] July 24, 1973

[54] INTEGRATED CIRCUIT FABRICATION METHOD

[75] Inventor: James L. Rutledge, Tempe, Ariz.

[73] Assignee: Motorola, Inc., Franklin Park, Ill.

[22] Filed: Mar. 31, 1972

[21] Appl. No.: 239,935

[52] U.S. Cl. .................................... 29/571, 29/577

[51] Int. Cl. ............................................ B01j 17/00

[58] Field of Search ...................... 29/571, 577, 578

[56] References Cited

UNITED STATES PATENTS

| | | | |
|---|---|---|---|
| 3,475,234 | 10/1969 | Kerwin et al. | 29/571 |
| 3,664,893 | 5/1972 | Frazee | 29/571 |
| 3,699,646 | 10/1972 | Vadasz | 29/571 |
| 3,673,471 | 6/1972 | Klein | 29/571 |

*Primary Examiner*—Charles W. Lanham
*Assistant Examiner*—W. C. Tupman
*Attorney*—Vincent J. Rauner and Henry T. Olsen

[57] ABSTRACT

There is disclosed a method of manufacturing insulated-gate field effect transistor integrated circuits which includes the steps of diffusing an interconnection pattern into the surface of a semiconductor wafer prior to the formation of the insulated-gate field effect transistor devices. The insulated-gate field effect transistor devices are formed by utilizing the gate as a mask for the source and drain diffusion so that the device is self-aligned.

4 Claims, 4 Drawing Figures

INTEGRATED CIRCUIT FABRICATION METHOD

BACKGROUND OF THE INVENTION

This invention relates to the manufacture of integrated circuits and more particularly to the manufacture of integrated circuits having active devices of the self-aligned, insulated-gate field effect transistor type.

In the manufacture of large scale integrated circuits utilizing insulated-gate field effect devices, it is customary to arrange the devices in a matrix of columns and rows so that convenient electrical interconnections may be made, generally in the spaces between the rows or columns of active devices. In conventional MOS integrated circuits where the gate is defined subsequent to the diffusion of the sources and drains, the sources and/or drains may be conveniently interconnected simultaneous with the diffusion of the active regions by extending the diffusion mask openings in an appropriate pattern. However, in the manufacture of MOS integrated circuits using a self-aligned gate technique, it has been necessary to provide two levels of metalization to perform the interconnection pattern for the sources, drains, and gates; because the gate pattern being defined prior to the diffusion of the sources and drains interrupts or intersects any attempt at diffusing the interconnect pattern simultaneous with the diffusion of the source and drain.

SUMMARY OF THE INVENTION

It is accordingly an object of the invention to provide a method of manufacturing self-aligned insulated-gate field effect transistor integrated circuits which eliminates the need for second level metalization. A further object of the invention is to provide a method of manufacturing integrated circuits of the aforementioned type which is reliable and economical.

In accordance with these objects, there is provided a method of manufacturing an insulated-gate field effect transistor integrated circuit device including the step of preliminarily diffusing a predetermined interconnection pattern into the surface of a semiconductor wafer, then forming the gate electrode pattern and subsequently forming the source and drain regions of the field effect transistors in a manner to interconnect the sources and drains with the predetermined interconnection pattern already in the surface of the wafer.

THE DRAWINGS

Figure 1:
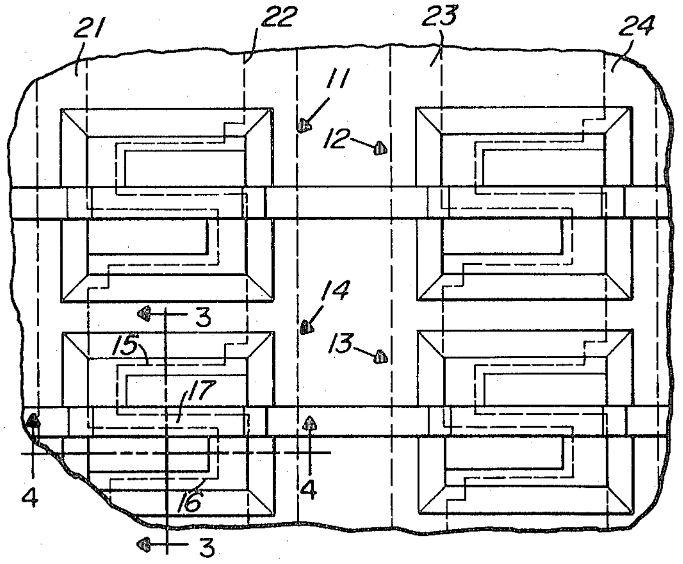
Figure 2:
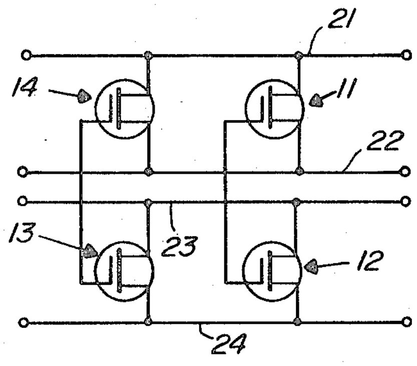
Figure 3:
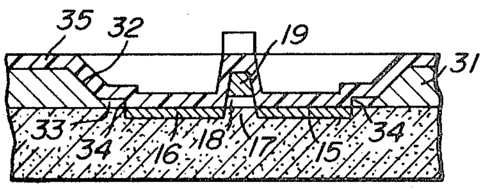
Figure 4:
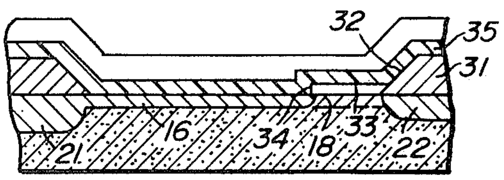

Further objects and advantages of the invention will be understood from the following complete description thereof and from the drawings wherein:

FIG. 1 is a plan view of a portion of an integrated circuit in accordance with the preferred embodiment thereof;

FIG. 2 is a circuit schematic of the portion of the integrated circuit depicted in FIG. 1; and FIGS. 3 and 4 are cross-sections of the device taken on lines 3—3 and 4—4 of FIG. 1, respectively.

COMPLETE DESCRIPTION

A portion of an integrated circuit manufactured in accordance with the invention is depicted in FIG. 1 includes a matrix of transistors 11, 12, 13 and 14. Each of the transistors 11 to 14 includes a source diffusion 15, and a drain diffusion 16, defining a channel 17 there between. Overlying the channel 17 is a thin gate oxide 18 and a gate electrode 19 (FIG. 3). Parallel interconnection conductor paths 21, 22, 23 and 24 connect the source and drain regions in the manner represented schematically in FIG. 2. As shown the source and drain regions of transistors 11 and 14 and transistors 12 and 13 are connected in respective parallel paths with the gates of transistors 11 and 12 and of 13 and 14 connected in series. It will be appreciated that the transistors may be connected in any predetermined desired pattern with the manufacturing process in accordance with the invention by appropriate design of the interconnect paths 21, 22, 23 and 24.

In accordance with the invention, the insulated-gate field effect transistor integrated circuit device having a self-aligned gate structure is manufactured by first diffusing a predetermined interconnection pattern into the surface of a semiconductor wafer. This is accomplished by covering the entire surface of the wafer with a suitable masking layer; for example, if the wafer is of silicon, silicon dioxide. Then utilizing standard photoresist techniques, the predetermined interconnection pattern is etched into the masking oxide and a relatively heavy diffusion formed in the surface of the wafer in the defined pattern. Thus, for example, the interconnection parallel paths 21, 22, 23 and 24 are preliminarily formed.

The masking oxide may then be removed and a relatively thick dielectric layer 31 (FIG. 3) formed on the surface of the wafer windows 32 are then formed in the relatively thick oxide layer 31. At least a portion of the interconnection pattern will be exposed in the window 32. A relatively thin dielectric layer 33 is then formed in the window 32 on the surface of the wafer—preferably by thermally growing an oxide thereon.

A polycrystaline silicon layer, to provide the gate electrodes 19 and interconnections, is then placed over the entire surface of the wafer. If desired, a suitable mask may be formed over the surface of the wafer and the polycrystaline silicon then deposited in a predetermined, desired pattern to form the gate electrodes and interconnection. If an entire layer of polycrystaline silicon is deposited on the surface, the polycrystaline material is then masked to define the gate and interconnect pattern as desired.

Windows 34 are then opened in the oxide layer 33 adjacent to the gate electrodes 19 and a diffusion step produces the source 15 and drain 16 immediately adjacent to the sides of the gate electrode 19. The polycrystaline gate electrode 15 also doped during the diffusion step to increase its conductivity while the gate electrode serves as a mask to define the channel 17 for the field effect transistor. The entire surface of the wafer may then be covered with a suitable dielectric layer such as a phosphorous doped glass to serve as a passivation layer for the integrated circuit.

While, as shown, the integrated circuit depicts a parallel connection of sources and drains of the field effect transistors, it will be appreciated that the diffused conductive paths may be utilized as to connect the transistors in series by merely off-setting the source and drain of adjacent transistors in the same direction rather than opposite directions. Further, it is not necessary that the diffused conductor paths be perpendicular to the direction of the gate electrodes but may be parallel thereto to derive any particularly desirable circuit configuration. In a fully developed integrated circuit, the preliminary diffused pattern may, in fact, include both parallel and perpendicular paths. In any case it will be seen that there is provided a method of interconnecting the active devices of a self-aligned gate field effect transistor in a convenient manner without the requirement for a second layer of metalization. While the invention has been disclosed by way of a preferred embodiment thereof, it will be appreciated that other suitable modification may be made therein without departing from the spirit and scope of the invention.

What is claimed is:

1. A method of manufacturing an insulated-gate field effect transistor integrated circuit device comprising the steps of:

diffusing a predetermined interconnection pattern into a surface of a semiconductor wafer;

forming a relatively thick dielectric layer covering the surface of the wafer;

opening windows through said thick dielectric layer thereby exposing predetermined portions of the surface of said wafer and said interconnection pattern;

forming a relatively thin dielectric layer on said exposed portions of said surface;

forming gate electrodes on said relatively thin dielectric layer and a gate electrode interconnection pattern on said relatively thick dielectric layer;

opening windows in said thin dielectric layer adjacent said gate electrodes thereby exposing predetermined portions of said diffused interconnection pattern; and diffusing regions into said windows thereby forming source and drain electrodes electrically interconnected in a predetermined pattern.

2. A method of manufacturing an integrated circuit device as recited in claim 1 wherein said relatively thin dielectric layer is formed by growth of a thermal oxide on the exposed portion of the surface.

3. A method of manufacturing an integrated circuit device as recited in claim 1 wherein said gate electrode and gate electrode interconnection pattern is of polycrystaline silicon and the step of forming diffused regions also increases the conductivity of the gate electrodes.

4. A method of manufacturing an integrated circuit device as recited in claim 1 wherein said semiconductor wafer is of silicon and said thin dielectric layer is silicon dioxide.

* * * * *